United States Patent
Kodama

(10) Patent No.: US 9,691,676 B2
(45) Date of Patent: Jun. 27, 2017

(54) SEMICONDUCTOR DEVICE AND METHOD FOR MANUFACTURING THE SAME

(71) Applicant: FUJITSU SEMICONDUCTOR LIMITED, Yokohama-shi, Kanagawa (JP)

(72) Inventor: Takeshi Kodama, Tachikawa (JP)

(73) Assignee: SOCIONEXT INC., Yokohama, Kanagawa ( * ) Notice: Subject to any disclaimer, the term of this patent is extended or adjusted under 35 U.S.C. 154(b) by 233 days.

(21) Appl. No.: 13/949,503

(22) Filed: Jul. 24, 2013

(65) Prior Publication Data
US 2014/0027920 A1    Jan. 30, 2014

(30) Foreign Application Priority Data

Jul. 30, 2012 (JP) .................................. 2012-168384

(51) Int. Cl.
*H01L 23/00* (2006.01)
*H01L 23/28* (2006.01)
(Continued)

(52) U.S. Cl.
CPC .............. *H01L 23/28* (2013.01); *H01L 21/56* (2013.01); *H01L 21/563* (2013.01);
(Continued)

(58) Field of Classification Search
CPC .......... H01L 24/05; H01L 24/04; H01L 24/06
See application file for complete search history.

(56) References Cited

U.S. PATENT DOCUMENTS

| 2002/0195703 | A1   | 12/2002 | Kameda   |            |
|--------------|------|---------|----------|------------|
| 2004/0046252 | A1 * | 3/2004  | Fujimori | H01L 21/563 |
|              |      |         |          | 257/734    |

(Continued)

FOREIGN PATENT DOCUMENTS

| JP | 2002-299380 A | 10/2002 |
| JP | 2004-172412 A | 6/2004  |

(Continued)

OTHER PUBLICATIONS

Japanese Office Action dated Dec. 15, 2015, issued in counterpart Japanese Patent Application No. 2012-168384, with partial English translation. (6 pages).

*Primary Examiner* — William Harriston
(74) *Attorney, Agent, or Firm* — Westerman, Hattori, Daniels & Adrian, LLP

(57) ABSTRACT

A semiconductor device includes a first semiconductor chip including a first surface and a plurality of first electrodes disposed on the first surface; a second semiconductor chip including a second surface which faces the first surface, a plurality of second electrodes each of which includes at least one end disposed on the second surface, and a plurality of first protrusions each of which surrounds the one end of each of the second electrodes on an electrode by electrode basis; a plurality of conductive joint materials each of which joins a third electrode included in the first electrodes to the one end of an electrode which faces the third electrode among the second electrodes; and a plurality of first underfill resins each of which is disposed inside one of the first protrusions and covers one of the conductive joint materials on a material by material basis.

15 Claims, 21 Drawing Sheets

(51) Int. Cl.
  H01L 21/56    (2006.01)
  H01L 23/055   (2006.01)
  H01L 23/367   (2006.01)
  H01L 23/48    (2006.01)
  H01L 25/065   (2006.01)
  H01L 21/768   (2006.01)
  H01L 23/42    (2006.01)

(52) U.S. Cl.
  CPC ...... *H01L 21/76898* (2013.01); *H01L 23/055* (2013.01); *H01L 23/3675* (2013.01); *H01L 23/481* (2013.01); *H01L 24/11* (2013.01); *H01L 24/13* (2013.01); *H01L 24/16* (2013.01); *H01L 24/73* (2013.01); *H01L 24/81* (2013.01); *H01L 25/0657* (2013.01); *H01L 23/42* (2013.01); *H01L 24/32* (2013.01); *H01L 24/33* (2013.01); *H01L 2224/10145* (2013.01); *H01L 2224/10175* (2013.01); *H01L 2224/11422* (2013.01); *H01L 2224/131* (2013.01); *H01L 2224/1319* (2013.01); *H01L 2224/13082* (2013.01); *H01L 2224/13101* (2013.01); *H01L 2224/16146* (2013.01); *H01L 2224/16147* (2013.01); *H01L 2224/16225* (2013.01); *H01L 2224/16227* (2013.01); *H01L 2224/26145* (2013.01); *H01L 2224/26175* (2013.01); *H01L 2224/291* (2013.01); *H01L 2224/32145* (2013.01); *H01L 2224/32245* (2013.01); *H01L 2224/73203* (2013.01); *H01L 2224/73204* (2013.01); *H01L 2224/81191* (2013.01); *H01L 2224/81355* (2013.01); *H01L 2224/81815* (2013.01); *H01L 2224/81862* (2013.01); *H01L 2224/81905* (2013.01); *H01L 2225/06513* (2013.01); *H01L 2225/06541* (2013.01); *H01L 2225/06568* (2013.01); *H01L 2225/06589* (2013.01)

(56) References Cited

U.S. PATENT DOCUMENTS

| | | | |
|---|---|---|---|
| 2009/0321947 A1* | 12/2009 | Pratt | ............. H01L 23/481 257/777 |
| 2011/0074015 A1 | 3/2011 | Suzuki | |
| 2012/0119346 A1 | 5/2012 | Im et al. | |

FOREIGN PATENT DOCUMENTS

| | | |
|---|---|---|
| JP | 2011-071381 A | 4/2011 |
| JP | 2012-109572 A | 6/2012 |
| WO | 2005/076352 A1 | 8/2005 |

* cited by examiner

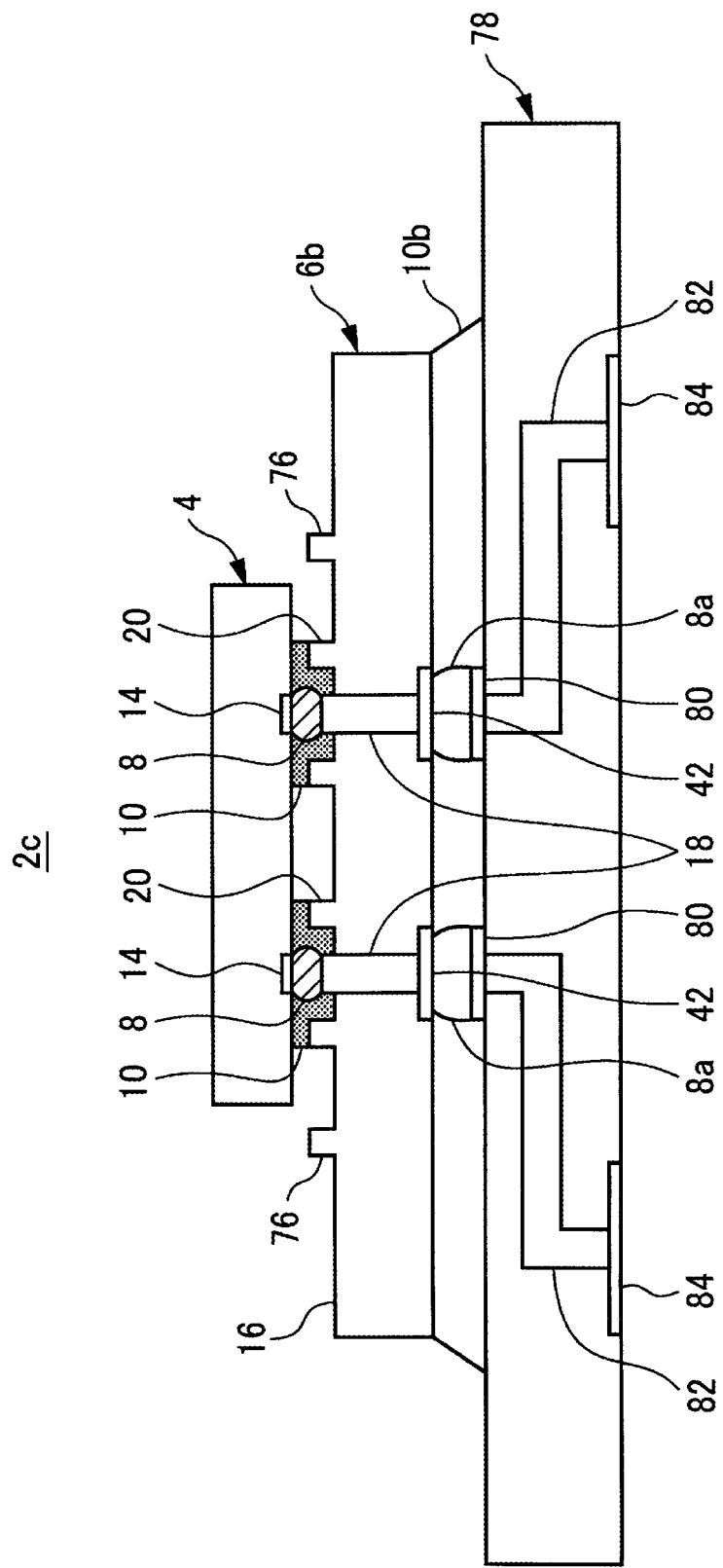

SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2012-168384, filed on Jul. 30, 2012, the entire contents of which are incorporated herein by reference.

FIELD

The embodiments discussed herein are related to a semiconductor device and a method for manufacturing the same.

BACKGROUND

One method for mounting a semiconductor chip on another semiconductor chip is flip chip mounting, in which solder bumps are formed on electrodes of one semiconductor chip and the bumps are connected to electrodes of the other semiconductor chip.

In the flip chip mounting, after the one semiconductor chip is mounted on the other semiconductor chip, a liquid underfill resin is injected between the semiconductor chips. Thereafter, the liquid underfill resin is heated and hardened. The hardened underfill resin protects joint parts between the semiconductor chips. (For example, refer to Japanese National Publication of International Patent Application WO2005/076352.)

SUMMARY

According to an aspect of the embodiments, a semiconductor device includes a first semiconductor chip including a first surface and a plurality of first electrodes disposed on the first surface; a second semiconductor chip including a second surface which faces the first surface, a plurality of second electrodes each of which includes at least one end disposed on the second surface, and a plurality of first protrusions each of which surrounds the one end of each of the second electrodes on an electrode by electrode basis; a plurality of conductive joint materials each of which joins a third electrode included in the first electrodes to the one end of an electrode which faces the third electrode among the second electrodes; and a plurality of first underfill resins each of which is disposed inside one of the first protrusions and covers one of the conductive joint materials on a material by material basis.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 22 depicts a cross section of a semiconductor device according to an embodiment 3;

DESCRIPTION OF EMBODIMENTS

As described previously, in the flip chip mounting, a liquid underfill resin is injected between the semiconductor chips after the one semiconductor chip is mounted on the other semiconductor chip.

When the underfill resin is injected between the semiconductor chips, a portion of the injected underfill resin flows out from a gap between the semiconductor chips. After flowing out, the underfill resin is hardened on the surface of a lower semiconductor chip, and causes inconvenience such as making difficult heat dissipation of the lower semiconductor chip by a heat spreader and warping the lower semiconductor chip.

According to the disclosed device, a semiconductor device capable of suppressing the outflow of an underfill resin from between semiconductor chips is provided.

Preferred embodiments will be explained with referenced to accompanying drawings, identical symbols are given to corresponding parts even in different drawings, and description thereof will be omitted.

Embodiment 1

(1) Structure

Figure 1:
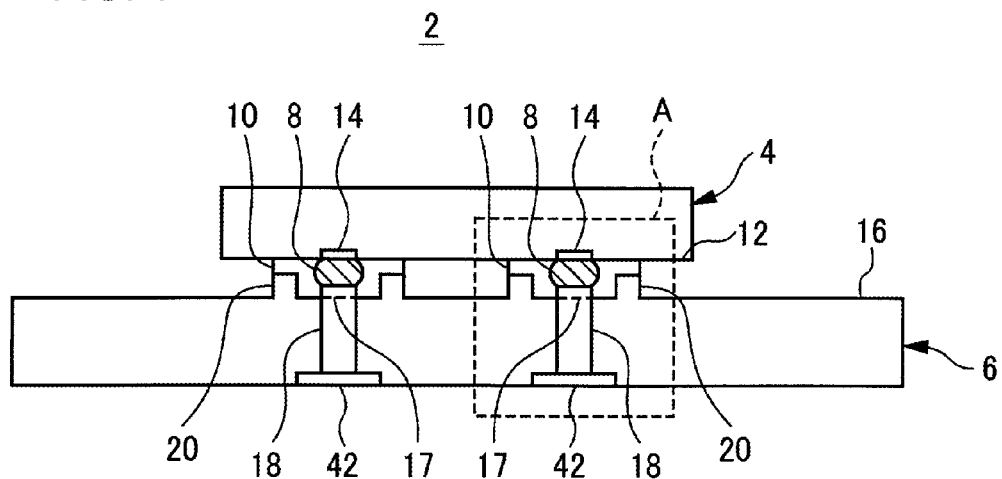
FIG. 1 depicts a cross section of a semiconductor device according to an embodiment 1.

FIG. 1 depicts a cross section of a semiconductor device 2 according to an embodiment 1.

As depicted in FIG. 1, the semiconductor device 2 includes a first semiconductor chip 4, a second semiconductor chip 6, a plurality of conductive joint materials 8 and a plurality of underfill resins (first underfill resins) 10.

The first semiconductor chip 4 includes a first surface 12 and a plurality of first electrodes 14 disposed on the first surface 12. The first semiconductor chip 4 further includes an integrated circuit (not illustrated) on the first surface 12, for example. The first electrodes 14 are connected to the integrated circuit.

Figure 2:
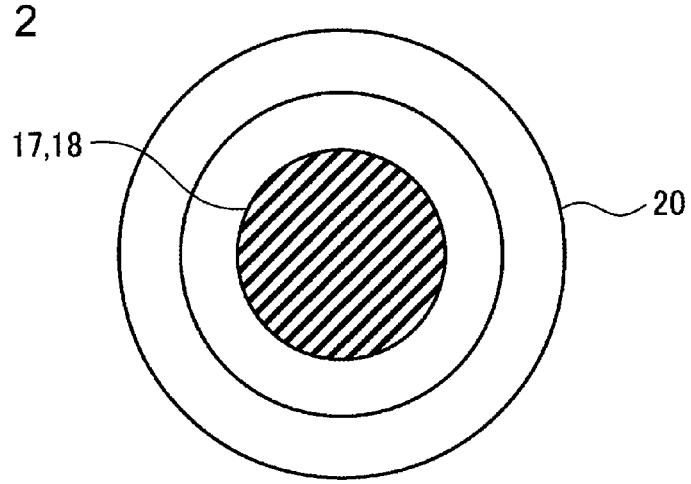
FIG. 2 is an enlarged plan view in which the vicinity of one end of each second electrode is illustrated.

The second semiconductor chip 6 includes a second surface 16 which faces the first surface 12, and a plurality of second electrodes 18, each of which includes one end 17 disposed on the second surface 16. FIG. 2 is an enlarged plan view in which the vicinity of one end 17 of each second electrode 18 is illustrated. As illustrated in FIGS. 1 and 2, the second semiconductor chip 6 further includes a plurality of protrusions 20, each of which surrounds the one end 17 of each of the second electrodes 18 on an electrode-by-electrode basis (i.e. separately).

For example, the second electrodes 18 are electrodes which pass through a semiconductor substrate included in the semiconductor chip 6 of the semiconductor device 2 (e.g., through-silicon vias). Some electrodes among the second electrodes 18 may be connected to an integrated circuit (not illustrated) included in the second semiconductor chip 6.

As depicted in FIG. 1, each of the conductive joint materials 8 joins each electrode included in the first electrodes 14 (hereafter referred to as the third electrode) to one end 17 of an electrode which faces the third electrode among the second electrodes 18 (i.e., the electrode which faces the third electrode is one of the second electrodes 18). The conductive joint materials 8 are solder bumps, for example.

As depicted in FIG. 1, each of the underfill resins 10 is disposed inside one of the protrusions 20, to cover one of the joint materials 8 on a material-by-material basis. The underfill resins 10 further cover regions contacting to the joint materials 8 (e.g., a portion of the first surface 12 and a portion of the second surface 16).

It is difficult for the joint materials 8 to rigidly join the electrodes together. However, the underfill resins 10 cover the joint materials 8 and the regions contacting to the joint materials 8, to reinforce joint between the first electrodes 14 and the second electrodes 18.

For example, the underfill resin 10 is a resin obtained by thermally-hardening a liquid epoxy resin with a curing agent (i.e. hardener). The underfill resin 10 may be mixed with a filler such as a $SiO_2$ particle.

Figure 3:
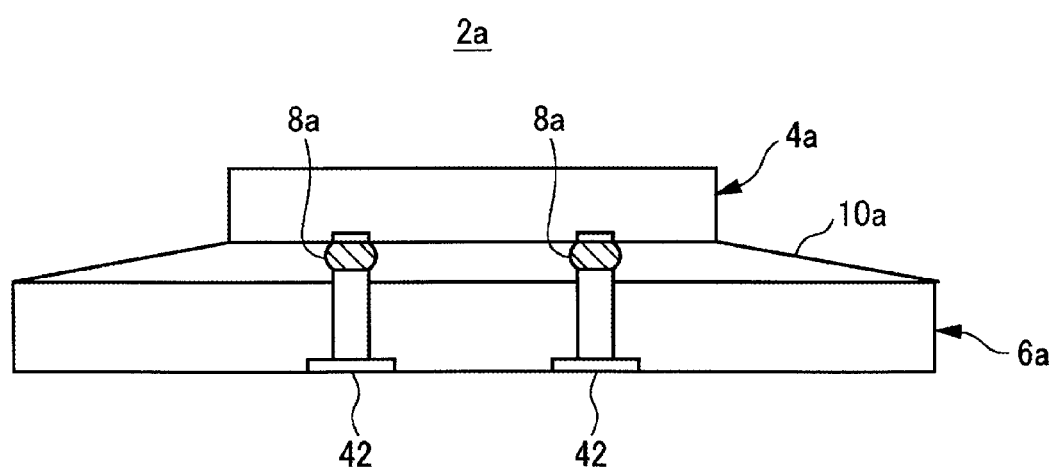
FIG. 3 depicts a cross section of a semiconductor device in which a second semiconductor chip does not include any protrusion.

FIG. 3 depicts a cross section of a semiconductor device 2a in which a second semiconductor chip 6a does not include any protrusion 20.

As depicted in FIG. 3, the semiconductor device 2a includes the semiconductor chip 6a, and another semiconductor chip 4a mounted on the semiconductor chip 6a. The semiconductor device 2a is formed by the following procedure, for example.

First, the semiconductor chip 4a is mounted on the semiconductor chip 6a, and a liquid underfill resin is injected between the semiconductor chips 4a, 6a. Thereafter, the liquid underfill resin is heated and hardened (i.e. cured).

When the liquid underfill resin is injected between the semiconductor chips 4a, 6a, a portion of the liquid underfill resin flows out to the outside of the upper semiconductor chip 4a.

After flowing out, the underfill resin is hardened at a region outside the upper semiconductor chip 4a in the surface area of the lower semiconductor chip 6a. This causes inconvenience such as making difficult heat dissipation of the lower semiconductor chip 6a by a heat spreader and warping the lower semiconductor chip 6a.

In contrast, in the semiconductor device 2 according to the embodiment 1, each underfill resin 10 is confined inside each protrusion 20, without flowing out from between the semiconductor chips 4, 6, as depicted in FIG. 1.

Figure 4:
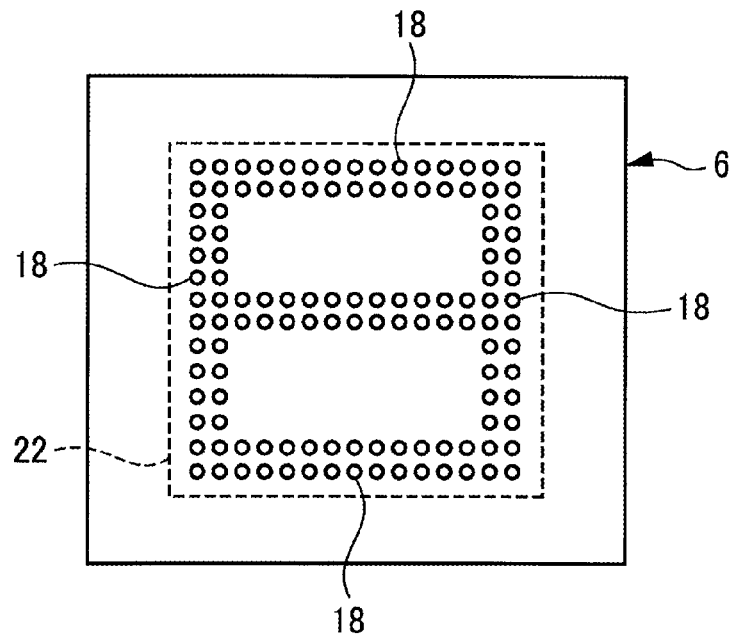
FIG. 4 depicts an exemplary layout of the second electrodes on the second surface.

Now, in FIG. 1, each number of the first electrodes 14 and the second electrodes 18 is two. However, each number of the first electrodes 14 and the second electrodes 18 may be three or more. FIG. 4 depicts an exemplary layout of the second electrodes 18 on the second surface 16 (refer to FIG. 1). In FIG. 4, the protrusion 20 is omitted. A region 22 enclosed with broken lines in FIG. 4 is a region corresponding to the first semiconductor chip 4.

As depicted in FIG. 4, each second electrode 18 is formed in a portion of the region 22 corresponding to the first semiconductor chip 4. The diameter of the second electrode 18 is 5-10 μm, for example. The pitch between each second electrode 18 is around 50 μm, for example.

In the case that the second electrode 18 is a through via, semiconductor devices formed on the second semiconductor chip 6 (for example, transistor and capacitor) are formed so as to be away from the second electrode 18.

Figure 5:
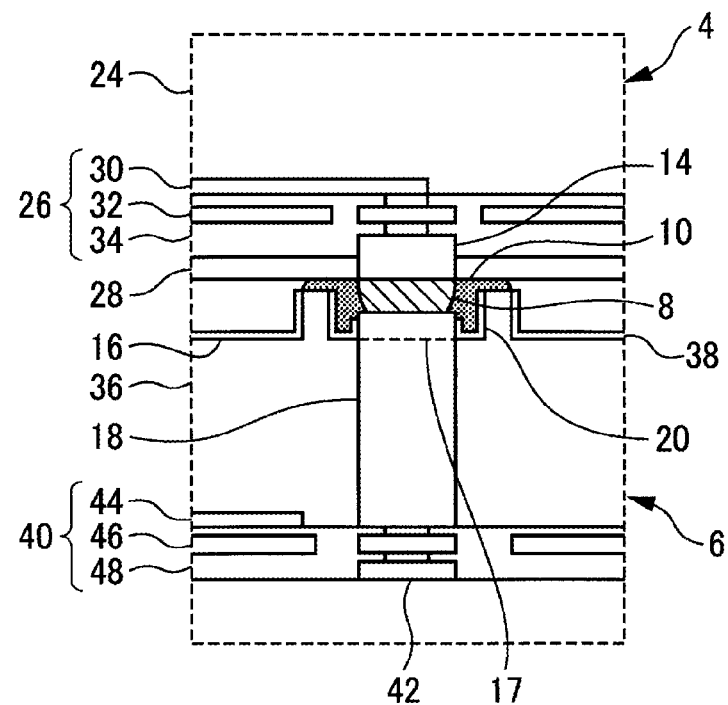
FIG. 5 depicts an enlarged view of the region A enclosed by the broken lines in FIG. 1.

FIG. 5 depicts an enlarged view of the region A enclosed by the broken lines in FIG. 1.

As depicted in FIG. 5, the first semiconductor chip 4 includes a semiconductor substrate (for example, Si substrate) 24, an integrated circuit 26, an insulating protection film (for example, polyimide film) 28 and the first electrodes 14.

The integrated circuit 26 includes a semiconductor device 30 formed on the semiconductor substrate 24, wiring (including via) 32 and an interlayer insulating film (for example, $SiO_2$ film) 34, for example. The integrated circuit 26 is covered with the protection film 28, and the surface of the first electrode 14 is disposed at an opening formed on the protection film 28.

Similarly, as depicted in FIG. 5, the second semiconductor chip 6 includes a semiconductor substrate (for example, Si substrate) 36, the protrusions 20, an insulating film (for example, $SiO_2$ film) 38 covering the second surface 16, an integrated circuit 40, the second electrodes 18 and fourth electrodes 42. The fourth electrodes 42 are disposed on the opposite surface of the second semiconductor chip 6 from the second surface 16.

The integrated circuit 40 includes semiconductor devices 44 formed on the semiconductor substrate 36 (for example, transistor and capacitor), wiring (including via) 46 and an interlayer insulating film (for example, $SiO_2$ film) 48, for example.

The second electrode 18 is, for example, a through via passing through the semiconductor substrate 36. To one end 17 of the second electrode 18, the first electrode 14 is connected through a joint material 8, whereas to the other end of the second electrode 18, the fourth electrode 42 is connected. To the other end of the second electrode 18, the integrated circuit 40 may be connected.

To the fourth electrode 42, the second electrode 18 or the integrated circuit 40 is connected. The surface of the integrated circuit 40 may be covered with a protection film, similar to the integrated circuit 26 of the first semiconductor chip 4.

A signal is input to (and/or output from) the second semiconductor chip 4 through the second electrode 18, for example. Also, a signal is input to (and/or output from) the second semiconductor chip 6, through the fourth electrode 42 or another electrode on the surface where the fourth electrode 42 is disposed, for example. Signal transmission/reception between the first semiconductor chip 4 and the second semiconductor chip 6 is performed through the second electrode 18, for example.

The second semiconductor chip 6 has a thickness of 20 μm or more and 100 μm or less, for example. A semiconductor chip having such a thin formation is easily warped because of the difference of a coefficient of thermal expansion between the underfill resin and the semiconductor substrate. However, according to the semiconductor 2 of the embodiment 1, the warp of the semiconductor chip 6 is restrained because the underfill resin 10 is localized in the vicinity of the joint material 8.

Now, in the semiconductor device 2 depicted in FIG. 1, the second electrode 18 is a through via. However, the second electrode 18 may be an electrode pad (for example, an electrode on a rewiring layer) disposed on the second surface 16 of the second semiconductor chip 6. In that case, entire second electrodes 18 are disposed on the second surface 16.

Further, in the semiconductor device 2 depicted in FIG. 1, the first electrode 14 is an electrode pad disposed on the first surface 12. However, the first electrode 14 may be one end of a through via. In that case, one end of the first electrode 14 is disposed on the first surface 12. The integrated circuit of the first semiconductor chip 4 is disposed, for example, on the opposite side of the first semiconductor chip 4 from the first surface 12.

(2) Manufacturing Method

FIGS. 6A to 8 and FIGS. 11A to 13 depict process cross sections of the manufacturing method of the semiconductor device 2. FIGS. 9A to 10B are enlarged process cross sections in which the vicinity of the head of the second electrode 18 is illustrated.

--Protrusion Formation Process--

Figure 6A:
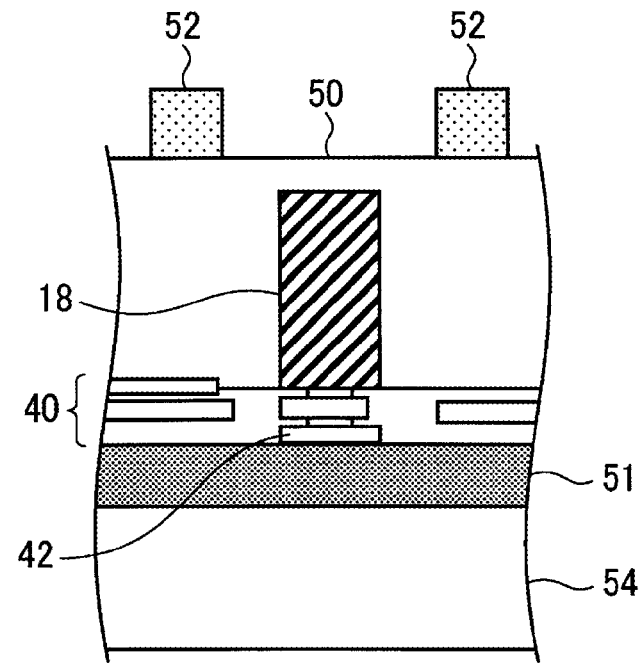
FIGS. 6A and 6B depict process cross sections of the manufacturing method of the semiconductor device.

First, as depicted in FIG. 6A, the front side of a semiconductor wafer (semiconductor substrate) 50 including an integrated circuit etc. (integrated circuit 40, second electrodes 18 and fourth electrode 42) corresponding to the second semiconductor chip 6 is fixed on a support substrate 54 by an adhesive 51. Thereafter, on the back side of the semiconductor wafer 50, a resist pattern 52 corresponding to the protrusion 20 is formed.

As depicted in FIG. 6A, the second electrode 18 is an electrode (such as Cu and W) extending from the front side of the semiconductor wafer 50 toward the back side.

Figure 9A:
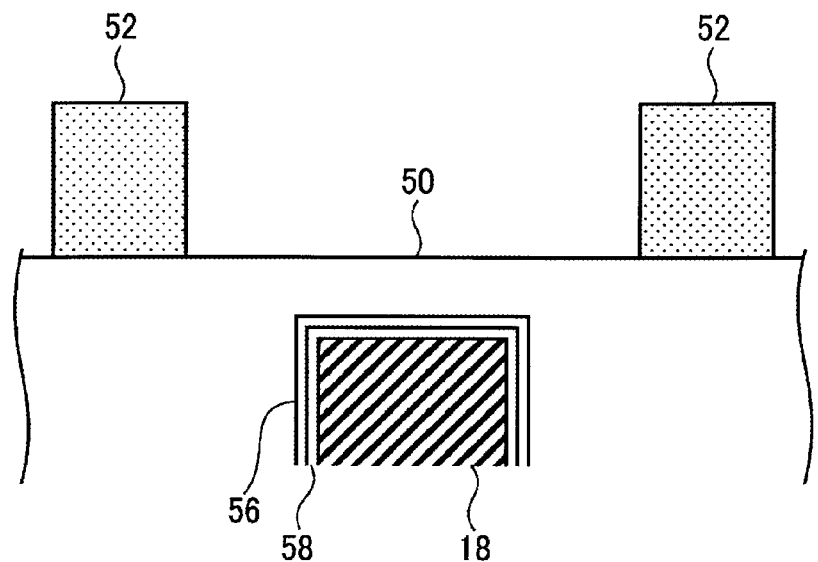
FIGS. 9A and 9B are enlarged process cross sections in which the vicinity of the head of the second electrode is illustrated.

The second electrode 18 is buried in a via hole. One end of the via hole reaches the front side of the semiconductor wafer 50, and the other end is closed. As depicted in FIG. 9A, on the wall of the via hole, a barrier layer 58 (such as TiN film, Ti film and TaN film) and an insulating film 56 (such as a $SiO_2$ film) are formed.

Figure 6B:
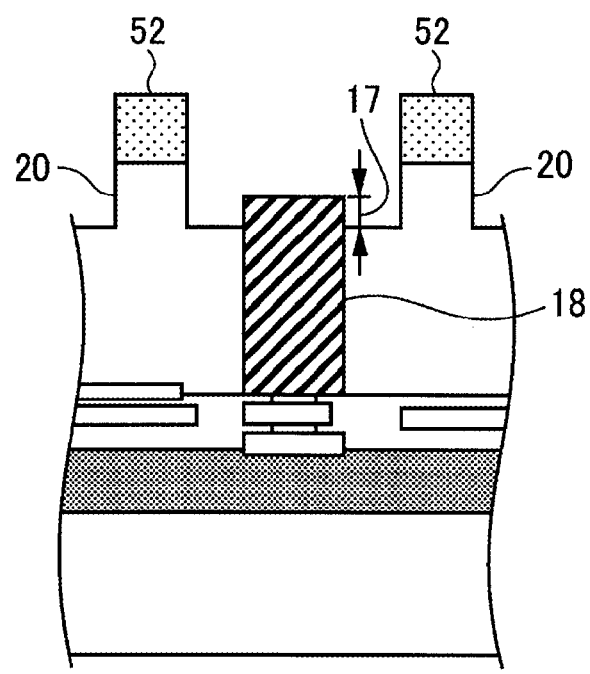
Figure 7A:
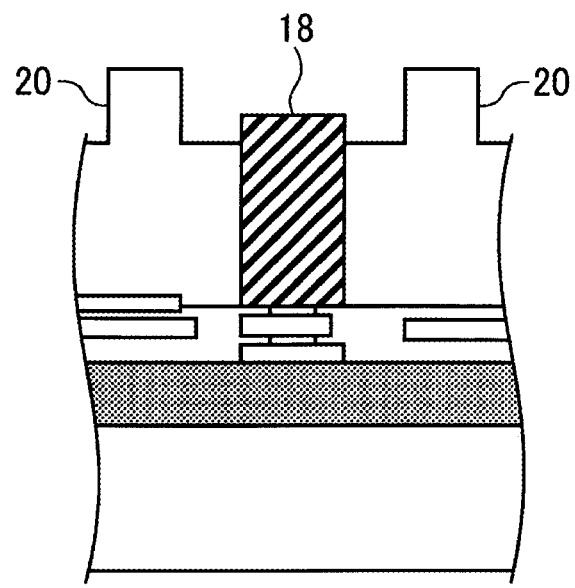
FIGS. 7A and 7B depict process cross sections of the manufacturing method of the semiconductor device.

Next, as depicted in FIG. 6B, using the resist pattern 52 as an etching mask, the back side of the semiconductor wafer 50 is etched by anisotropic dry etching, so as to form the protrusion 20 and expose one end 17 of each of the second electrodes 18. After dry etching, the resist pattern 52 is removed, as depicted in FIG. 7A.

Figure 9B:
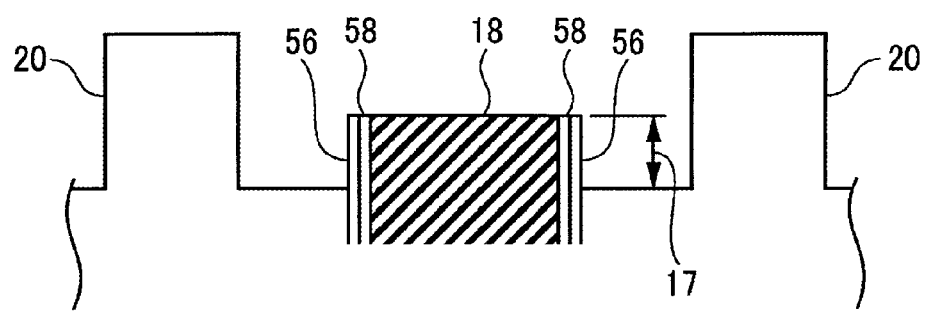

In the first half of the above etching, the semiconductor wafer 50 is etched. In the second half of the etching, an area of the insulating film 56 which covers the upper surface of the second electrode 18 is removed together with the semiconductor wafer 50, as depicted in FIG. 9B. Further, an area of the barrier layer 58 which covers the upper surface of the second electrode 18 is removed.

The semiconductor wafer 50 and the insulating film 56 are etched by anisotropic dry etching using, for example, a gas containing fluorine (such as $CF_4$) as a reaction gas. The barrier layer 58 is etched by anisotropic dry etching using, for example, a gas containing chlorine (such as $Cl_2$) as a reaction gas.

Figure 7B:
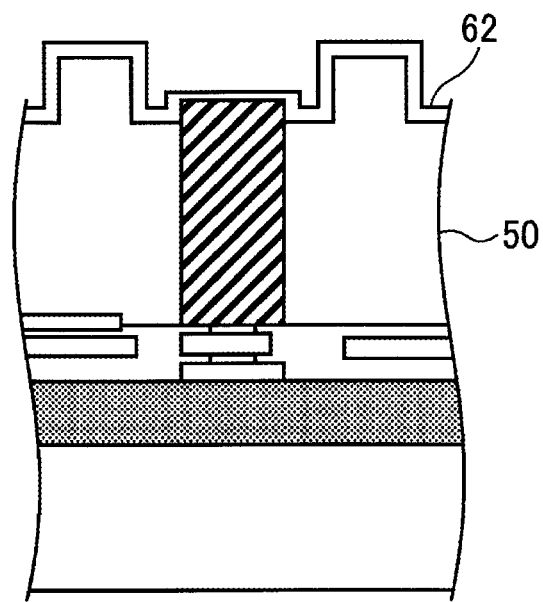
Figure 10A:
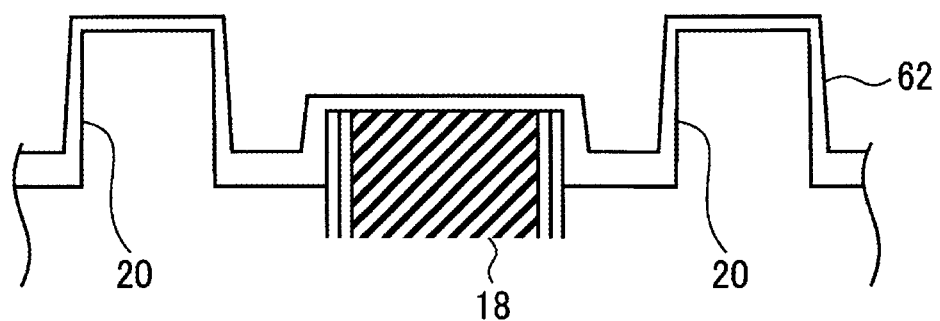
FIGS. 10A and 10B are enlarged process cross sections in which the vicinity of the head of the second electrode 18 is illustrated.

Next, as depicted in FIG. 7B, an insulating film 62 is formed by applying an organic material (such as benzocyclobutene (BCB) and polyimide) on the back side of the semiconductor wafer 50 by spin-coating, for example. As depicted in FIG. 10A, the insulating film 62 is thinned on the upper surface of the second electrode 18 and the upper surface of the protrusion 20.

Figure 8:
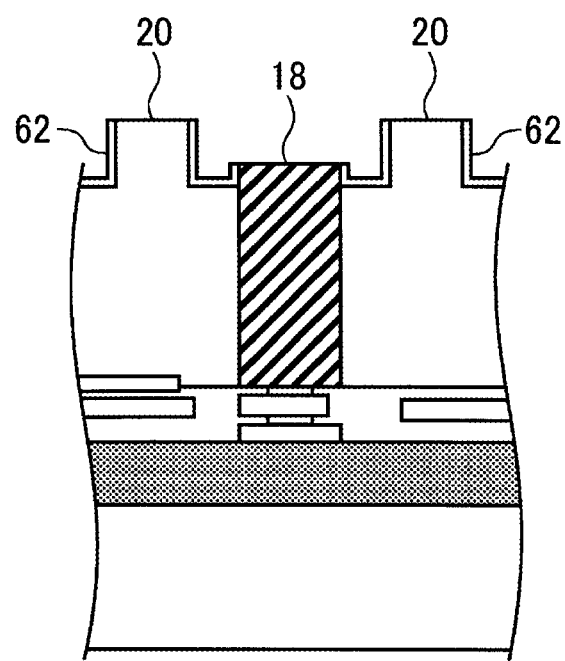
FIG. 8 depicts a process cross section of the manufacturing method of the semiconductor device.
Figure 10B:
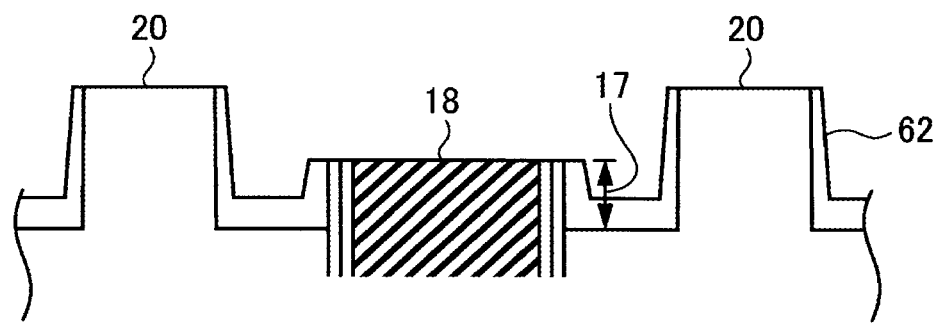

By etching the thinned insulating film 62 by anisotropic dry etching, the head of the second electrode 18 and the upper surface of the protrusion 20 are exposed, as depicted in FIGS. 8 and 10B.

Thereafter, the semiconductor wafer 50 is divided into each individual second semiconductor chip 6.

--Liquid Underfill Applying Process--

Figure 11A:
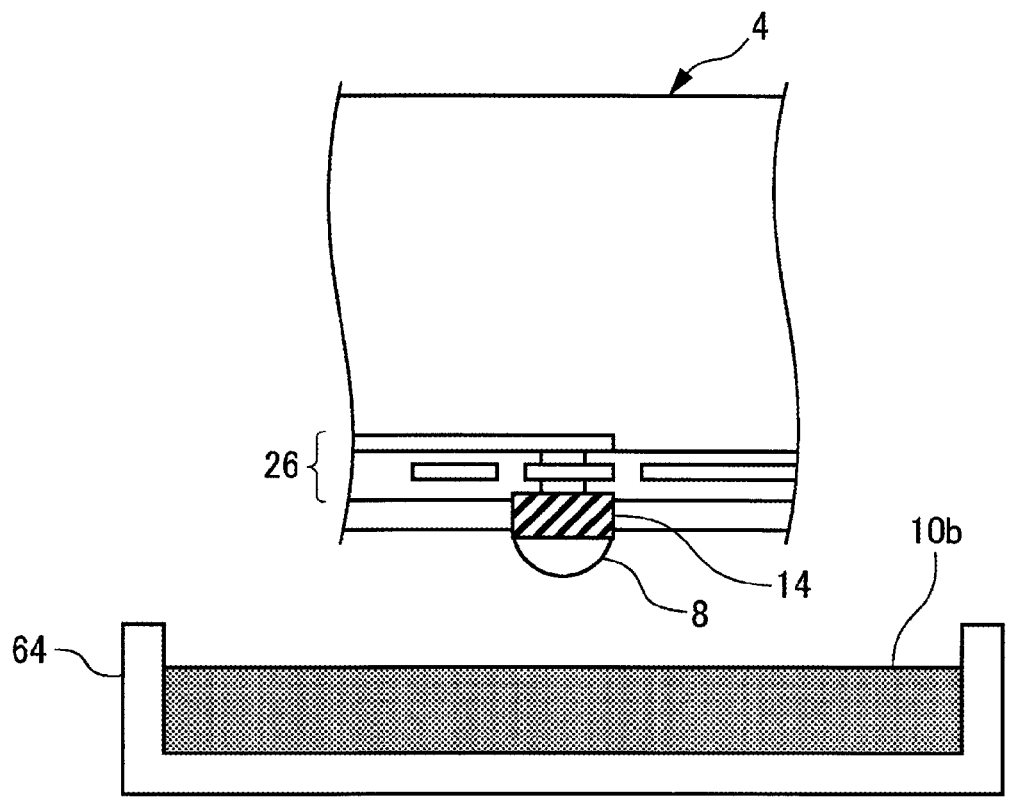
FIGS. 11A and 11B depict process cross sections of the manufacturing method of the semiconductor device.

First, a liquid underfill resin is prepared. An underfill resin 10b is accommodated into, for example, a vessel 64 having no lid, as depicted in FIG. 11A.

Figure 11B:
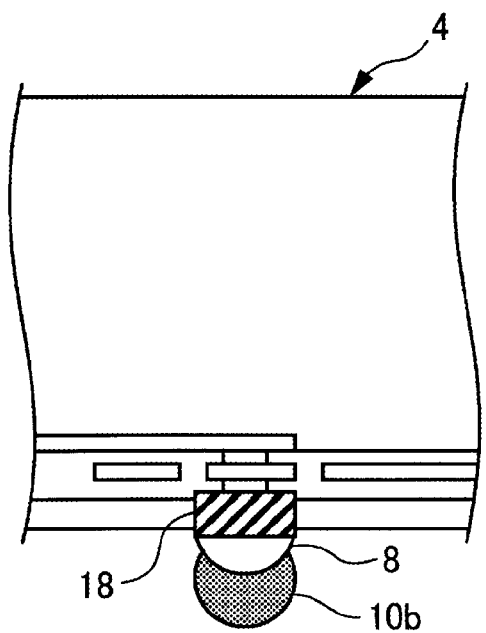

Next, a conductive joint material 8 is disposed (joined) on each of the first electrodes 14 disposed on one side of the first semiconductor chip 4, and the disposed joint material 8 is brought into contact with the underfill resin 10b in the vessel 64. Then, as depicted in FIG. 11B, the liquid underfill resin 10b is applied to the joint material 8.

The joint material 8 is, for example, a SnAg solder bump. The liquid underfill resin 10b is, for example, a liquid epoxy resin mixed with a curing agent and a filler. Preferably, the liquid underfill resin 10b is mixed with flux to remove the oxide of the joint material 8.

--Joint Material Disposing Process--

Figure 12:
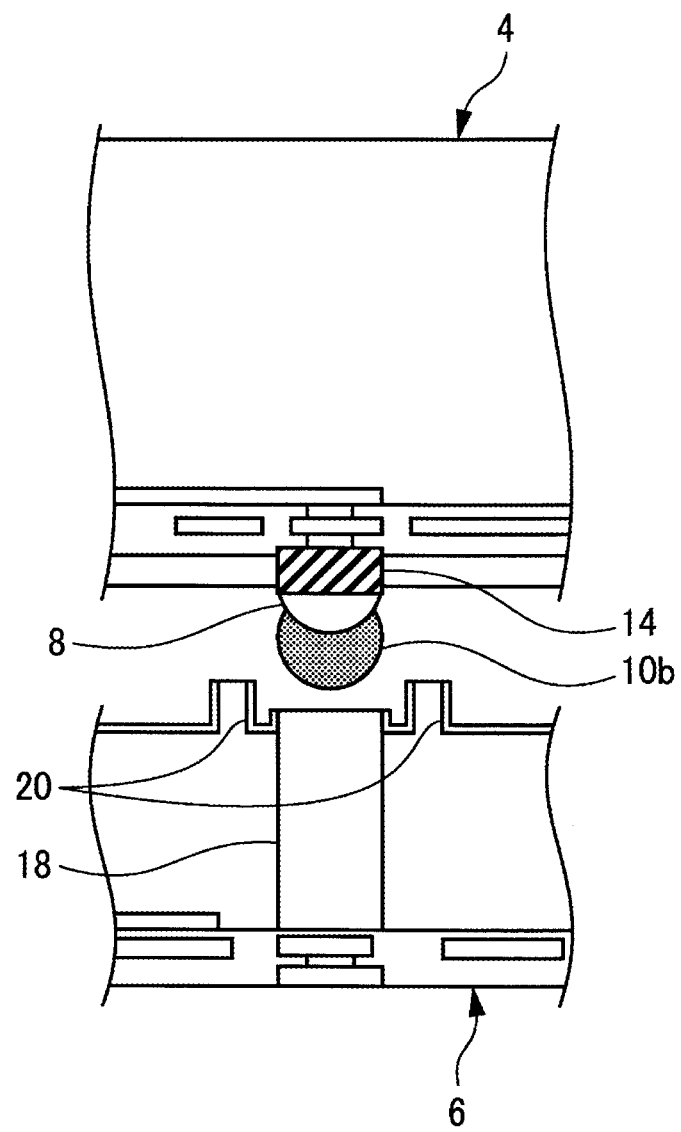
FIG. 12 depicts a process cross section of the manufacturing method of the semiconductor device.

As depicted in FIG. 12, above each of the second electrodes 18, the joint material 8 with the liquid underfill resin 10b adhering thereto is disposed. Thereafter, the joint material 8 is brought into contact with each second electrode 18. Namely, the individual joint material 8, to which the liquid underfill resin 10b is applied, is disposed on each of the second electrodes 18.

As depicted in FIG. 12, each of second electrodes 18 includes one end, which is exposed on the one side of the second semiconductor chip 6 and is surrounded by respective protrusions 20. The liquid underfill resin 10b is confined inside the protrusion 20, and does not easily flow out to the outside of the protrusion 20.

--Joint Process--

After the joint material 8 is disposed on each second electrode 18, the joint material 8 and the liquid underfill resin 10b are heated, so as to join the first electrodes 14 to the second electrodes 18. The first electrode 14 and the second electrode 18 are joined by reflow processing, for example. Heating temperature is a temperature (for example, approximately 250° C.) higher than the melting point of the joint material 8.

The above heating processing hardens the liquid underfill resin 10b to a certain extent. Thereafter, the underfill resin 10b is additionally heated for a long time (for example, several tens of minutes), so as to sufficiently harden the underfill resin 10b inside the protrusion 20. Heating temperature is, for example, 150-160° C. It may also be possible to sufficiently harden the underfill resin 10b by elongating the heating time of the joint material 8 without additional heating.

Figure 13:
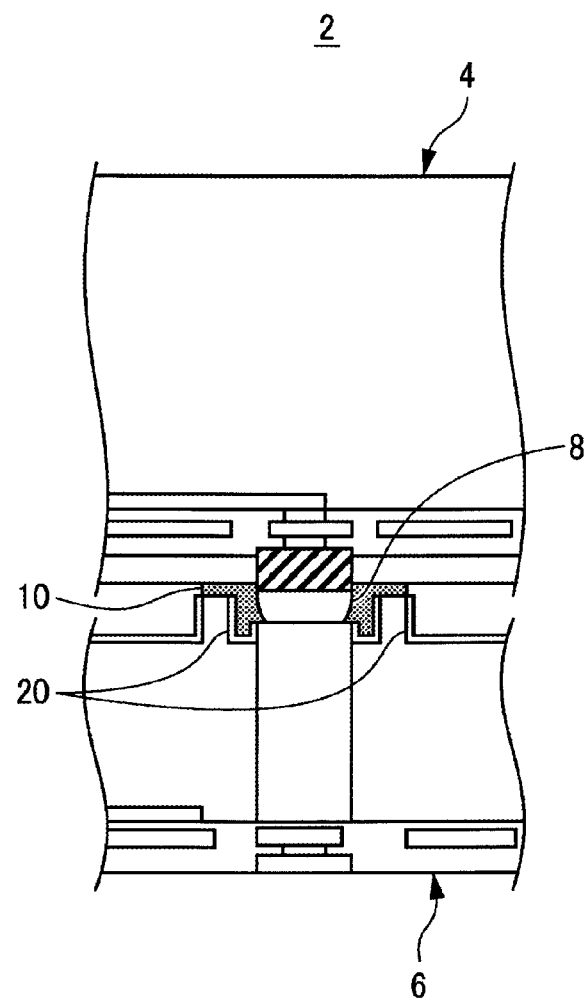
FIG. 13 depicts a process cross section of the manufacturing method of the semiconductor device.

Through the above heating processing, a sufficiently hardened underfill resin 10 covering the joint material 8 is formed in the inside of each protrusion 20, as depicted in FIG. 13. The liquid underfill resin 10b is hardened in a state of being confined inside the protrusion 20.

Thus, the liquid underfill resin 10b is prevented from flowing out from between the first semiconductor chip 4 and the second semiconductor chip 6 and being hardened on the surface of the second semiconductor chip 6 (excluding a portion facing the first semiconductor chip 4).

An amount of the underfill resin 10b adhering to the joint material 8 is small. Therefore, the underfill resin 10b does not fill the overall gaps between the first semiconductor chip 4 and the second semiconductor chip 6. However, the underfill resin 10b fills a gap between the first semiconductor chip 4 and the second semiconductor chip 6 around the joint material 8 because the underfill resin 10b is confined inside the protrusion 20. By this, the strength of the joint material 8 is sufficiently reinforced.

Figure 14:
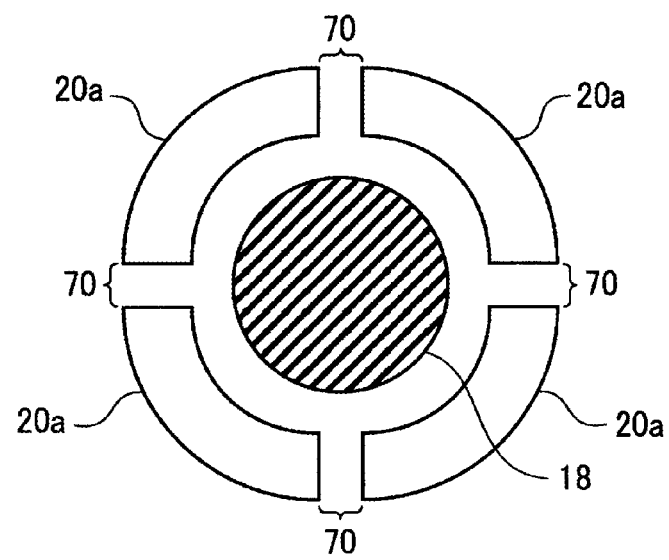
FIG. 14 depicts a plan view of a deformed example of the protrusion.

FIG. 14 depicts a plan view of a deformed example of the protrusion. The protrusion 20 depicted in FIG. 2 is closed. However, as depicted in FIG. 14, a protrusion 20a may include an absent portion 70. If the width of the absent portion 70 is small, the liquid underfill resin 10b hardly flows out to the outside of the protrusion 20a.

Figure 15A:
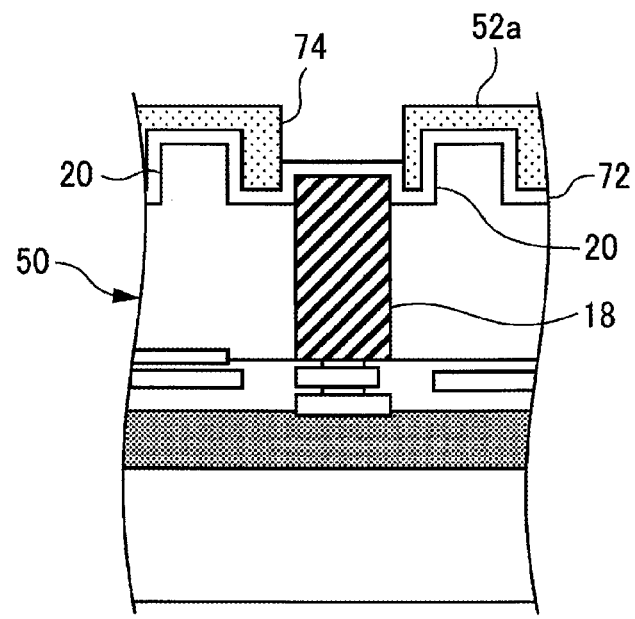
FIGS. 15A and 15B depict process cross sections of another formation method of the insulating film.
Figure 15B:
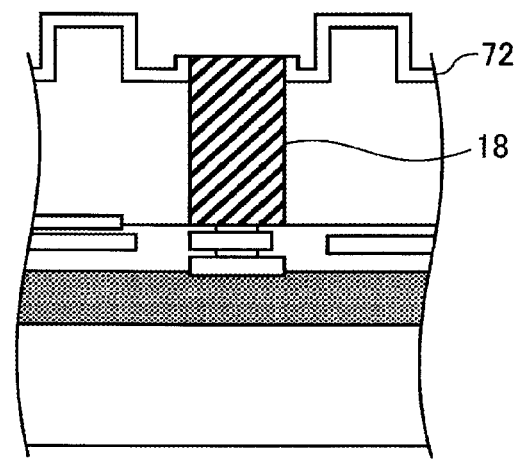

FIGS. 15A, 15B depict process cross sections of another formation method of the insulating film 62.

In the formation method described by reference to FIGS. 10A and 10B, the insulating film 62 which exposes the upper surface of the second electrode 18 and the upper surface of the protrusion 20 is formed using behavior of an organic insulating film.

In contrast, according to the formation method depicted in FIG. 15A, an inorganic insulating film (for example, $SiO_2$ film) 72 is formed on the back side of the semiconductor wafer 50 on which the protrusion 20 is formed. On the inorganic insulating film 72, there is formed a resist pattern 52a provided with an opening 74 above the second electrode 18. Thereafter, the inorganic insulating film 72 is etched to form an insulating film which exposes the upper surface of the second electrode 18, as depicted in FIG. 15B.

Embodiment 2

Figure 16:
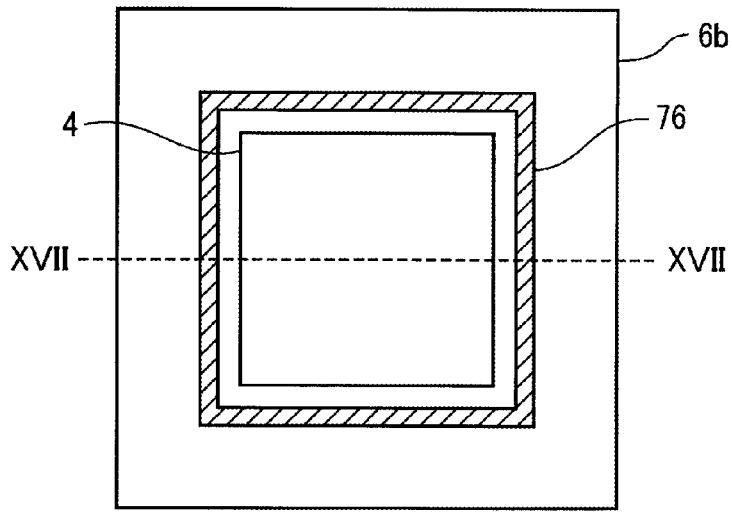
FIG. 16 depicts a plan view of a semiconductor device according to an embodiment 2.
Figure 17:
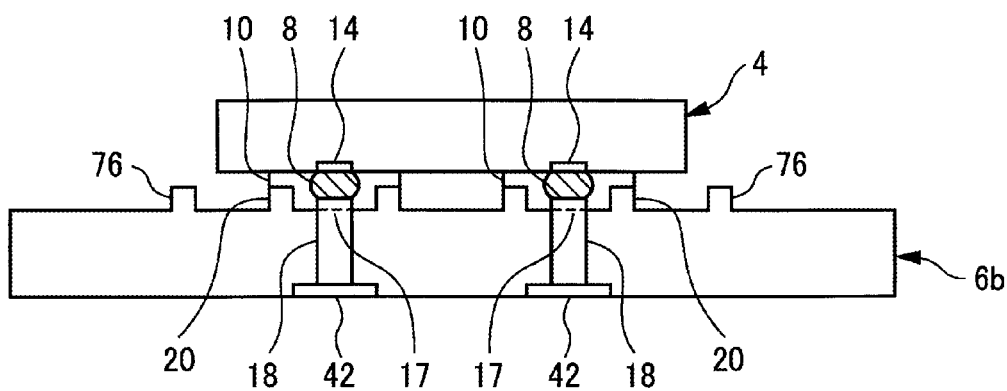
FIG. 17 depicts a cross section along the XVII-XVII line depicted in FIG. 16.

FIG. 16 depicts a plan view of a semiconductor device 2b according to an embodiment 2. FIG. 17 depicts a cross section along the XVII-XVII line depicted in FIG. 16. Descriptions common to the embodiment 1 will be omitted or simplified.

As depicted in FIGS. 16 and 17, the semiconductor device 2b includes a substantially identical structure to the semiconductor device 2 according to the embodiment 1. However, as depicted in FIG. 16, a second semiconductor chip 6b includes another protrusion 76 which surrounds the first semiconductor chip 4 in a plan view. Protrusions 20 (hereafter referred to as first protrusions), each of which surrounds the one end 17 of each second electrode 18, are disposed inside the other protrusion 76 (hereafter referred to as second protrusion).

According to the manufacturing method of the semiconductor device 2b, a resist pattern corresponding to the first protrusions 20 and the second protrusion 76 is formed on the back side of a semiconductor wafer (semiconductor wafer corresponding to the second semiconductor chip 6b) including the second electrodes 18. Thereafter, using the resist pattern as an etching mask, the semiconductor wafer 50 is dry etched. By the dry etching, the first protrusions 20 and the second protrusion 76 are formed.

Figure 18A:
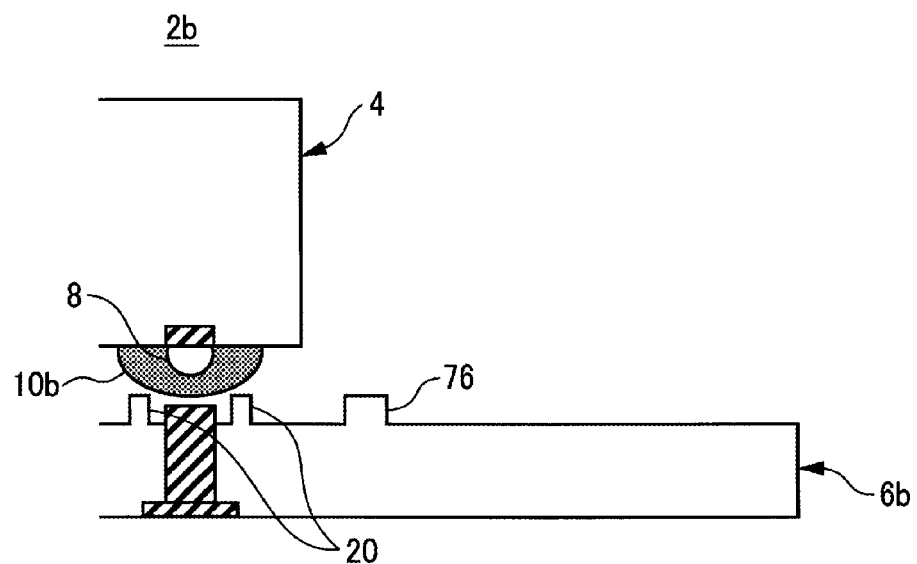
FIGS. 18A and 18B depict diagrams illustrating the prevention of the outflow of an underfill resin by means of the semiconductor device according to the embodiment 2.

As depicted in FIG. 18A, Except for the resist pattern formed on the back side of the semiconductor wafer, the manufacturing method of the semiconductor device 2b is substantially identical to the manufacturing method of the semiconductor device 2 in the embodiment 1.

Figure 18B:
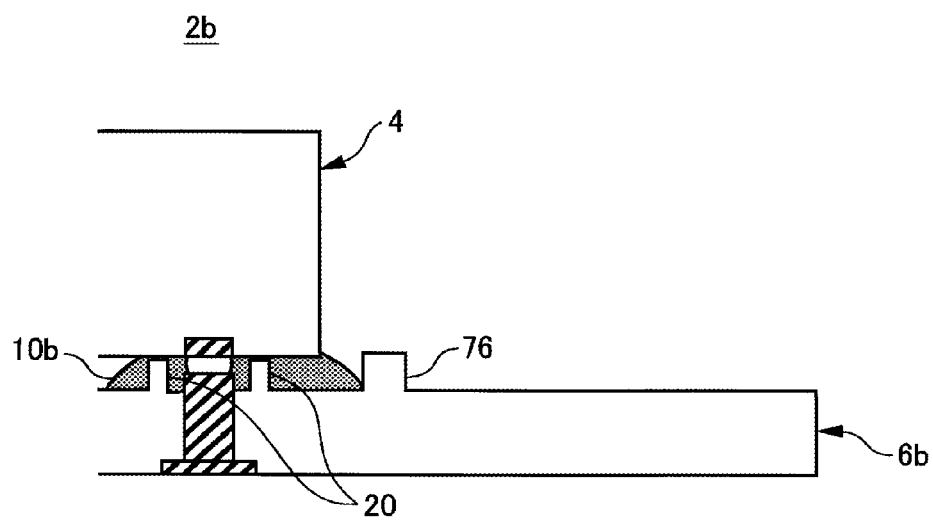

FIGS. 18A and 18B depict diagrams illustrating the prevention of the outflow of an underfill resin by means of the semiconductor device 2b according to the embodiment 2.

When a liquid underfill resin 10b is brought into contact with a joint material 8, in some cases, the liquid underfill resin 10b adheres excessively to the joint material 8.

In this case, as depicted in FIG. 18B, a portion of the underfill resin 10b flows out to the outside of a protrusion 20. However, by means of the semiconductor device 2b of the embodiment 2, the second protrusion 76 dams the underfill resin 10b, and thus the outflow of the underfill resin 10b from a gap between the semiconductor chips 4 and 6b is suppressed.

FIGS. 19A to 21B depict diagrams illustrating variations of the second protrusion 76. FIGS. 19A to 21B depict plan views in which the upper right corner of the semiconductor chip 6b is illustrated in close-up.

Figure 19A:
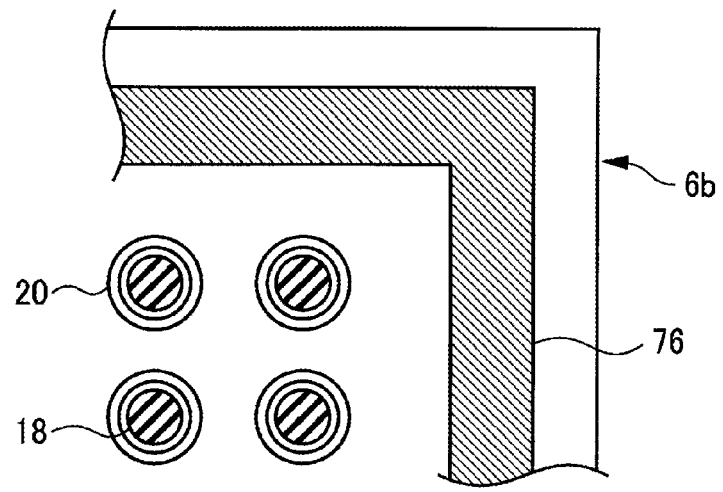
FIGS. 19A and 19B depict diagrams illustrating variations of the second protrusion.
Figure 19B:
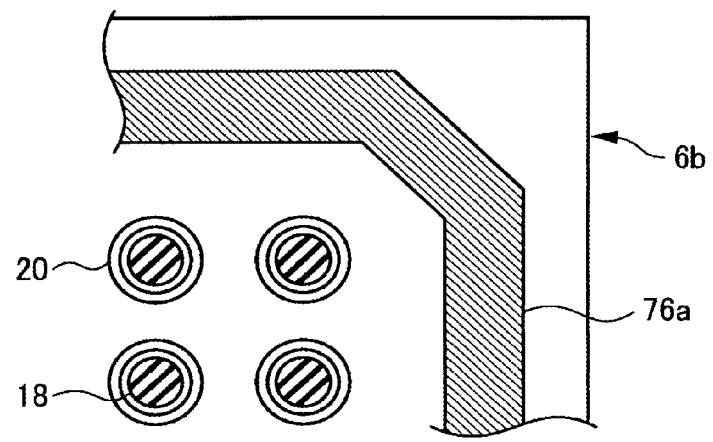

In the example depicted in FIG. 19A, the second protrusion 76 is bent once at each of the four corners. On the other hand, in the example depicted in FIG. 19B, the second protrusion 76a is bent twice at each of the four corners.

Figure 20A:
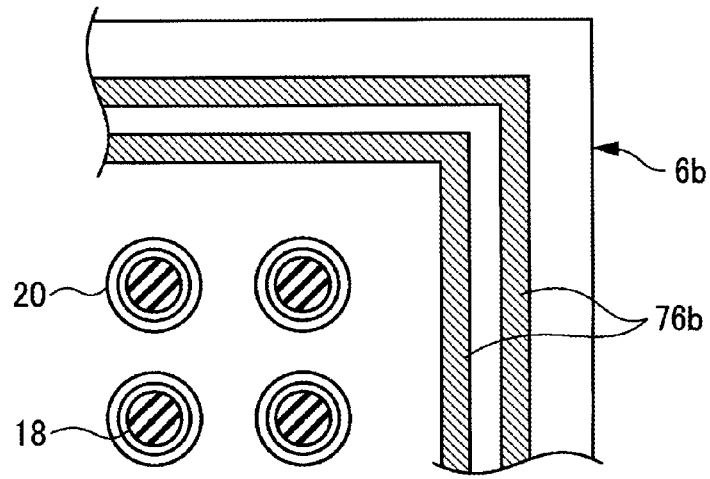
FIGS. 20A and 20B depict diagrams illustrating variations of the second protrusion.
Figure 20B:
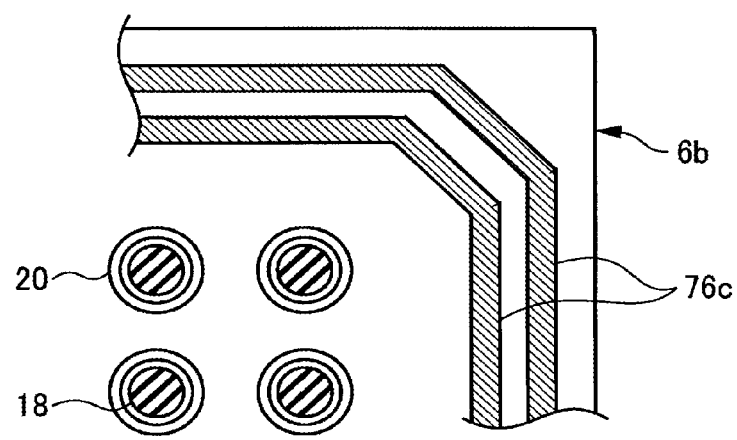

In the examples depicted in FIGS. 20A and 20B, second protrusions 76b, 76c are doubled. According to the examples depicted in FIGS. 20A and 20B, the underfill resin 10b which the inner protrusion out of the doubled protrusions 76b, 76c fails to dam may be dammed by the outer protrusion.

Figure 21A:
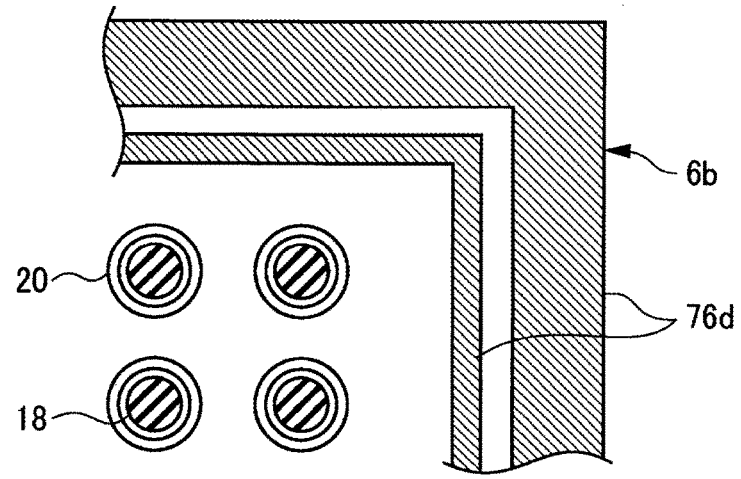
FIGS. 21A and 21B depict diagrams illustrating variations of the second protrusion.
Figure 21B:
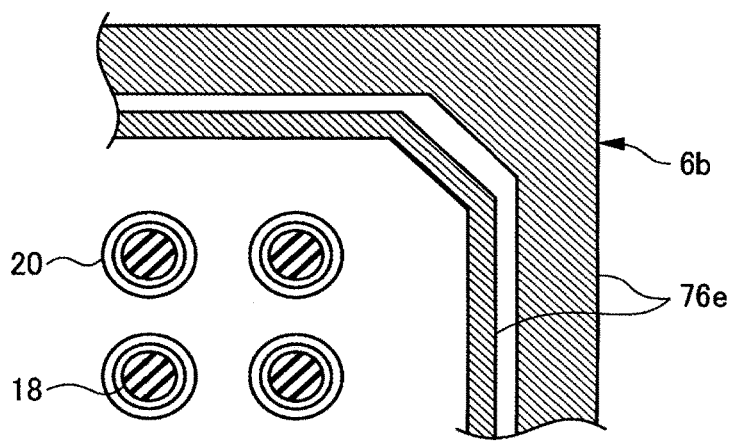

In the examples depicted in FIGS. 21A and 21B, each outer protrusion of doubled protrusions 76d, 76e is spread to the outer circumference of the second semiconductor chip 6b. According to the examples depicted in FIGS. 21A and 21B, each total area of the protrusions 76d, 76e is enlarged. Therefore, it becomes easier to pick up the second semiconductor chip 6b by vacuum absorption.

Embodiment 3

FIG. 22 depicts a cross section of a semiconductor device 2c according to an embodiment 3. Descriptions common to the embodiment 1 or 2 will be omitted or simplified.

As depicted in FIG. 22, the semiconductor device 2c includes a package substrate 78 disposed on the opposite side of the second semiconductor chip 6b from the first semiconductor chip 4.

As depicted in FIG. 22, the package substrate 78 is a multilayer wiring substrate (multilayer circuit board), for example. On the front side of the package substrate 78, fifth electrodes 80 are disposed. Further, on the back side of the package substrate 78, sixth electrodes 84 are disposed.

Each fifth electrode 80 is joined to each fourth electrode 42 of the second semiconductor chip 6b by a joint material (for example, solder bump) 8a. Further, each fifth electrode 80 is connected to one of the sixth electrodes 84 by wiring 82 disposed in the multilayer wiring substrate 78.

For example, the fourth electrode 42 is joined to the fifth electrode 80 according to a procedure described below.

First, a package substrate 78 having conductive joint materials 8a disposed on (joined to) each fifth electrode 80 is prepared. Next, the second semiconductor chip 6b is mounted on the package substrate 78 so that the fourth electrodes 42 of the second semiconductor chip 6b contact to the joint materials 8a. Thereafter, the fourth electrodes 42 are joined to the fifth electrode 80 by reflow processing.

Now, if an underfill resin 10a flows out from a gap between the semiconductor chips 4a, 6a and thermally cured on the lower surface of the semiconductor chip 6a as depicted in FIG. 3, the lower semiconductor chip 6a warps upward when the temperature is returned to a room temperature. The reason is that the thermal expansion coefficients of the underfill resin 10a and the semiconductor substrate are greatly different.

Therefore, it is difficult to make each fourth electrode 42 of the lower semiconductor chip 6a, depicted in FIG. 3, equally contact to each joint material 8a (refer to FIG. 22) disposed on the fifth electrode 80 of the package substrate 78.

The lower semiconductor chip 6a greatly warps on the outside of the first semiconductor chip 4a. Therefore, it is particularly difficult to make each fourth electrode 42 disposed outside the first semiconductor chip 4a equally contact to the joint material 8a disposed on the fifth electrode 80 of the package substrate 78.

In contrast, in the semiconductor device 2c according to the embodiment 3, the underfill resin 10 remains between the semiconductor chips 4, 6b without flowing out to the surface of the second semiconductor chip 6b (excluding a portion facing the first semiconductor chip 4). Therefore, such a problem as described above does not occur.

In the example depicted in FIG. 22, the second protrusion 76 is formed on the second semiconductor chip 6b. However, without forming the second protrusion 76, it may also be possible to form only the first protrusions 20 on the second semiconductor chip 6b.

Embodiment 4

Figure 23:
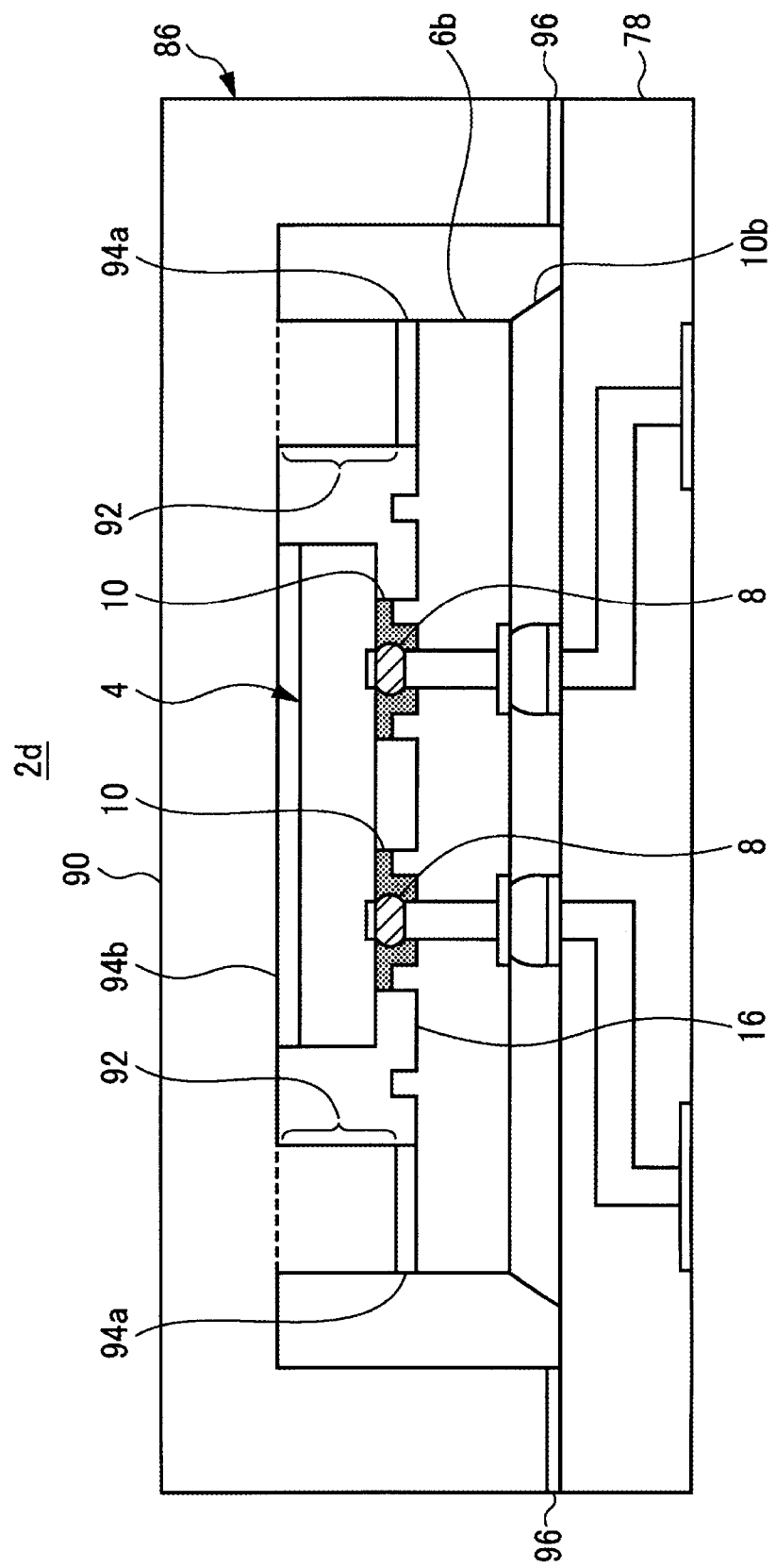
FIG. 23 depicts a cross section of a semiconductor device according to an embodiment 4.
Figure 24:
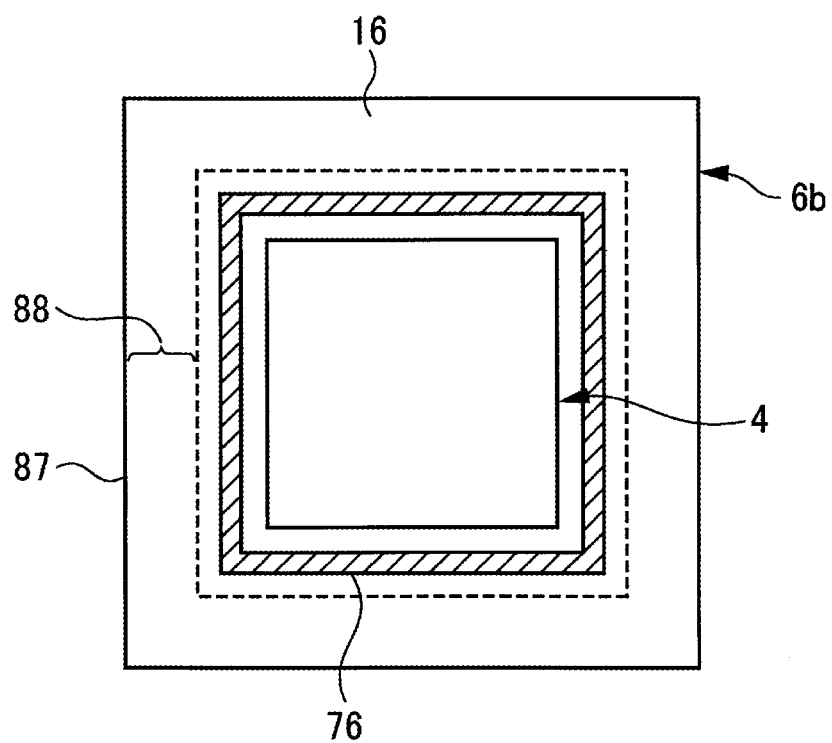
FIG. 24 depicts a plan view illustrating the layout of a heat spreader.

FIG. 23 depicts a cross section of a semiconductor device 2d according to an embodiment 4. Descriptions common to the embodiments 1 to 3 will be omitted or simplified. FIG. 24 depicts a plan view illustrating the layout of a heat spreader 86.

As depicted in FIG. 24, a semiconductor device 2d includes the heat spreader 86 (refer to FIG. 23) disposed on an area of the second surface 16 of the second semiconductor chip 6b which lies outside the first semiconductor chip 4 in a plan view (preferably outside the second protrusion 76).

The heat spreader 86 is disposed, for example, in a region 88 between the outer circumference 87 of the second semiconductor chip 6b and the second protrusion 76. As depicted in FIG. 23, the upper portion of the heat spreader 86 may be disposed on the opposite side of the first semiconductor chip 4 from the second semiconductor chip 6b.

The heat spreader 86 includes, for example, a lid-shaped cover 90 and a protrusion 92 protruding inward from the cover 90. The protrusion 92 contacts (thermally contacts) to the second semiconductor chip 6b through a thermal interface material (TIM) 94a. The upper portion of the cover 90 contacts (thermally contacts) to the first semiconductor chip 4 through another TIM 94b. The heat spreader 86 is attached to the package substrate 78 by an adhesive 96, for example.

The heat spreader 86 is formed of Cu and SiC, for example. Each TIM 94a, 94b is a solder sheet, a paste containing metal, etc.

Heat generated at the area of the second semiconductor chip 6b which lies outside the first semiconductor chip 4 is dissipated through the protrusion 92. Heat generated at the area of the second semiconductor chip 6b which lies inside the first semiconductor chip 4 is dissipated through the first semiconductor chip 4 and the cover 90.

When the heat spreader 86 is disposed on the lower semiconductor chip 6a of the semiconductor device 2a depicted in FIG. 3, the underfill resin 10a is sandwiched between the lower semiconductor chip 6a and the heat spreader 86. Then, the underfill resin 10a hinders dissipation of heat generated by the lower semiconductor chip 6a, so that the lower semiconductor chip 6a is not cooled insufficiently.

In contrast thereto, in the semiconductor device 2d according to the embodiment 4, the underfill resin 10 remains between the first semiconductor chip 4 and the semiconductor chip 6b. Therefore, heat generated by the second semiconductor chip 6b is efficiently dissipated through the protrusion 92 of the heat spreader 86, so that the second semiconductor chip 6b may be cooled sufficiently.

The heat spreader 86 depicted in FIG. 23 contacts to the first semiconductor chip 4 and the second semiconductor chip 6b. However, a plurality of heat spreaders may be disposed so that one of the heat spreaders contacts to the first semiconductor chip 4 and the other contacts to the second semiconductor chip 6b.

A gap between the package substrate 78 and the second semiconductor chip 6b is wider than a gap between the first semiconductor chip 4 and the second semiconductor chip 6b. Therefore, between the package substrate 78 and the semiconductor chip 6b, the underfill resin 10b having relatively high viscosity may be filled in. Accordingly, there is only a small amount of the underfill resin 10b flowing out from between the package substrate 78 and the second semiconductor chip 6b.

Embodiment 5

Figure 25:
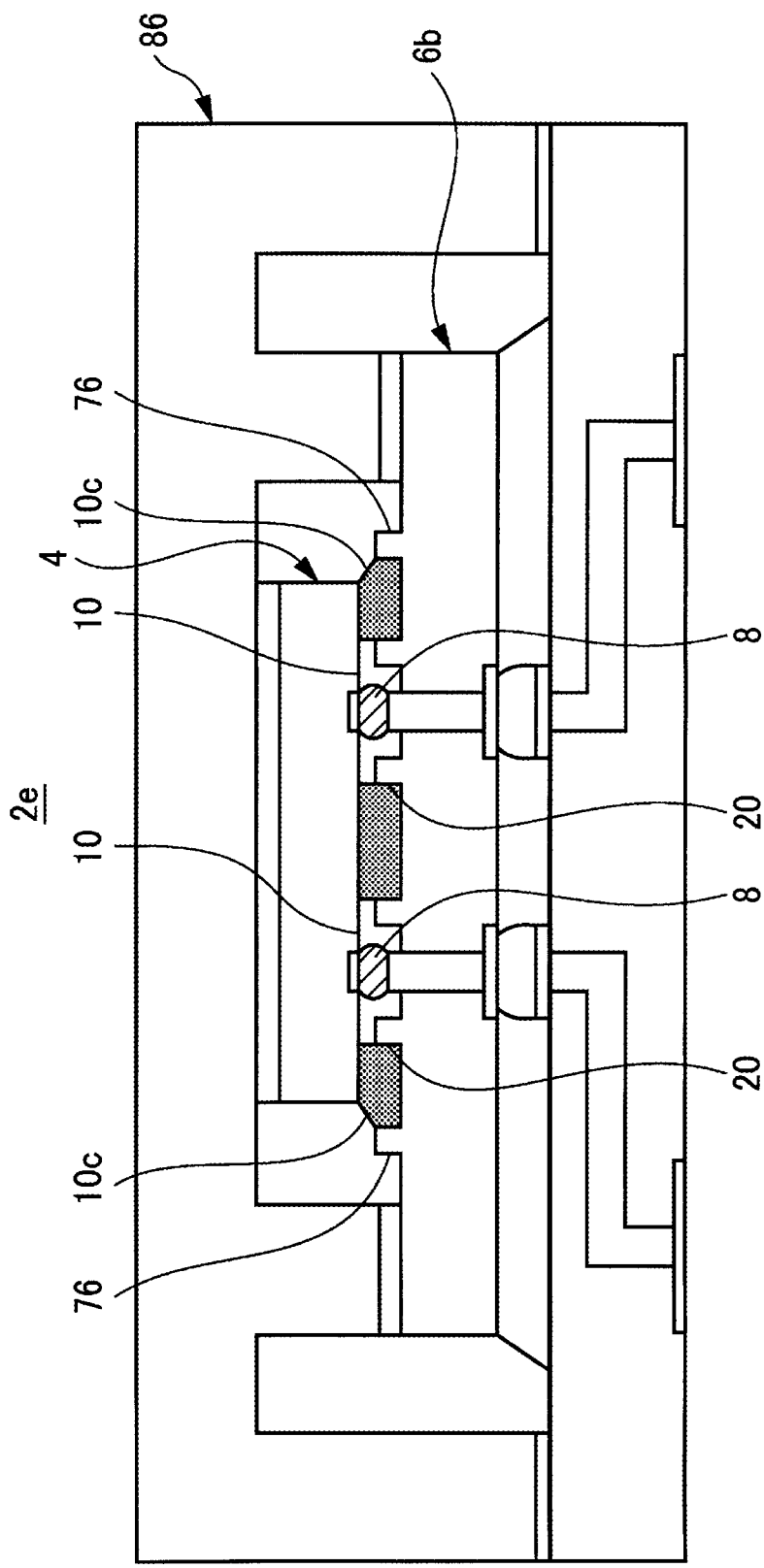
FIG. 25 depicts a cross section of a semiconductor device according to an embodiment 5.

FIG. 25 depicts a cross section of a semiconductor device 2e according to an embodiment 5. Descriptions common to the embodiments 1 to 4 will be omitted or simplified.

Compared to the semiconductor device 2d of the embodiment 4, the semiconductor device 2e further includes another underfill resin (second underfill resin) 10c which is disposed (filled in) between the first semiconductor chip 4 and the second semiconductor chip 6b and has thermal conductivity greater than the underfill resin 10 filled in the protrusion 20. The underfill resin 10c is injected from a gap between the first semiconductor chip 4 and the second protrusion 76 by a dispenser, for example.

In the semiconductor device 2d according to the embodiment 4 (refer to FIG. 23), heat generated by the second semiconductor chip 6b beneath the first semiconductor chip 4 conducts to the first semiconductor chip 4 through the joint material 8. In the semiconductor device 2e, the above heat conducts to the first semiconductor chip 4 through the underfill resin 10c having greater thermal conductivity.

Thus, the semiconductor device 2e dissipates heat generated by the second semiconductor chip 6b more efficiently, as compared with the semiconductor device 2d of the embodiment 4.

For example, the underfill resin 10c is a mixture of a liquid epoxy resin, a curing agent, and a filler such as a conductive particle (e.g., metallic particle) and a carbon nanotube. The resistance of the underfill resin 10c decreases with increase in the mixing ratio of the filler. Such a decrease in resistance results in leak current between the first semiconductor chip 4 and the second semiconductor chip 6b.

However, because the underfill resin 10 covering the joint material 8 is insulative, a leak current hardly flows between the first semiconductor chip 4 and the second semiconductor chip 6b.

In the aforementioned examples, the first protrusions 20 and the second protrusion 76 are formed by etching the second semiconductor chip 6b. However, the first protrusions 20 and the second protrusion 76 may be formed of solder, resin and the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first semiconductor chip which includes a first surface and a first electrode disposed on the first surface;
   a second semiconductor chip which includes a semiconductor substrate, a second surface which faces the first surface, a second electrode which includes at least one end disposed on the second surface and which faces the first electrode, and a first protrusion which surrounds the one end of the second electrode;
   a conductive joint material which joins the first electrode to the one end of the second electrode; and
   a first underfill resin which is disposed inside the first protrusion and covers the conductive joint material,
   wherein the first protrusion is included in the semiconductor substrate, and
   the first protrusion includes a material that is same material of the semiconductor substrate, and
   a heat spreader disposed on an area of the second surface which is outside the first semiconductor chip in a plan view.

2. The semiconductor device according to claim 1, wherein the second semiconductor chip further includes a second protrusion which surrounds the first semiconductor chip in a plan view.

3. The semiconductor device according to claim 2, further comprising:
   a second underfill resin, which has thermal conductivity greater than thermal conductivity of the first underfill resin, disposed between the first semiconductor chip and the second semiconductor chip; and
   a heat spreader disposed on an opposite side of the first semiconductor chip from the second semiconductor chip.

4. The semiconductor device according to claim 3, wherein the second underfill resin includes either one or both of a carbon nanotube and a conductive particle.

5. The semiconductor device according to claim 1, further comprising:
   a substrate disposed on an opposite side of the second semiconductor chip from the first semiconductor chip.

6. The semiconductor device according to claim 1, wherein the first electrode is connected to an integrated circuit included in the first semiconductor chip, and
   the second electrode is configured to pass through a semiconductor substrate included in the second semiconductor chip.

7. A semiconductor device comprising:
   a first semiconductor chip which includes a first surface and a first electrode disposed on the first surface;
   a second semiconductor chip which includes a semiconductor substrate, a second surface which faces the first surface, a second electrode which includes at least one end disposed on the second surface and which faces the first electrode, a first protrusion which surrounds the one end of the second electrode, and a second protrusion which surrounds the first semiconductor chip in a plan view, the first protrusion being included in the semiconductor substrate;
   a conductive joint material which joins the first electrode to the one end of the second electrode; and
   a first underfill resin which is disposed inside the first protrusion and covers the conductive joint material.

8. The semiconductor device according to claim 7, further comprising:
   a heat spreader disposed on an area of the second surface which is outside the first semiconductor chip in a plan view.

9. The semiconductor device according to claim 7, further comprising:
   a second underfill resin, which has thermal conductivity greater than thermal conductivity of the first underfill resin, disposed between the first semiconductor chip and the second semiconductor chip; and
   a heat spreader disposed on an opposite side of the first semiconductor chip from the second semiconductor chip.

10. The semiconductor device according to claim 9, wherein the second underfill resin includes either one or both of a carbon nanotube and a conductive particle.

11. The semiconductor device according to claim 7, further comprising:
    a substrate disposed on an opposite side of the second semiconductor chip from the first semiconductor chip.

12. The semiconductor device according to claim 7, wherein the first electrode is connected to an integrated circuit included in the first semiconductor chip, and
    the second electrode is configured to pass through a semiconductor substrate included in the second semiconductor chip.

13. A semiconductor device comprising:
    a first semiconductor chip which includes a first surface and a first electrode disposed on the first surface;
    a second semiconductor chip which includes a semiconductor substrate, a second surface which faces the first surface, a second electrode which includes at least one end disposed on the second surface and which faces the first electrode, and a first protrusion which surrounds the one end of the second electrode;
    a conductive joint material which joins the first electrode to the one end of the second electrode;

a first underfill resin which is disposed inside the first protrusion and covers the conductive joint material;
a substrate disposed on an opposite side of the second semiconductor chip from the first semiconductor chip,
wherein the first protrusion is included in the semiconductor substrate.

14. The semiconductor device according to claim 13, further comprising:
a heat spreader disposed on an area of the second surface which is outside the first semiconductor chip in a plan view.

15. The semiconductor device according to claim 13,
wherein the first electrode is connected to an integrated circuit included in the first semiconductor chip, and
the second electrode is configured to pass through a semiconductor substrate included in the second semiconductor chip.

* * * * *